United States Patent [19]

Widdoes, Jr.

[11] Patent Number: 4,635,218
[45] Date of Patent: Jan. 6, 1987

[54] METHOD FOR SIMULATING SYSTEM OPERATION OF STATIC AND DYNAMIC CIRCUIT DEVICES

[75] Inventor: L. Curtis Widdoes, Jr., Sunnyvale, Calif.

[73] Assignee: Valid Logic Systems, Mountain View, Calif.

[21] Appl. No.: 574,813

[22] Filed: Jan. 30, 1984

Related U.S. Application Data

[63] Continuation-in-part of Ser. No. 492,985, May 9, 1983, Pat. No. 4,590,581.

[51] Int. Cl.$^4$ .................. G06G 7/48; G06G 11/00
[52] U.S. Cl. ............................ 364/578; 371/20
[58] Field of Search ............ 364/578, 488–491, 364/579, 149–151; 371/20, 23, 24, 25–27

[56] References Cited

U.S. PATENT DOCUMENTS

| 4,070,565 | 1/1978 | Borrelli | 364/490 X |
| 4,242,751 | 12/1980 | Henckels et al. | 371/23 X |
| 4,342,093 | 7/1982 | Miyoshi | 371/23 X |
| 4,450,560 | 5/1984 | Conner | 371/27 X |

OTHER PUBLICATIONS

Dictionary definition of "digital" from *The American Heritage Dictionary*, p. 396.

*Primary Examiner*—Felix D. Gruber
*Assistant Examiner*—H. R. Herndon
*Attorney, Agent, or Firm*—Townsend and Townsend

[57] ABSTRACT

In a circuit system simulation model which may comprise a combination of physical dynamic circuit devices to be modeled, of physical static circuit devices to be modeled, and of means for controlling at least the operating sequence of the physical devices, a method is provided for exercising the circuit devices which comprises segregating strobe input signals from nonstrobe input signals to be presented to each circuit device and preserving order of strobe input transitions relative to each other and to nonstrobe input transitions while ignoring the order of nonstrobe input transitions relative to one another when presenting a sequence of input patterns to each circuit device.

17 Claims, 3 Drawing Figures

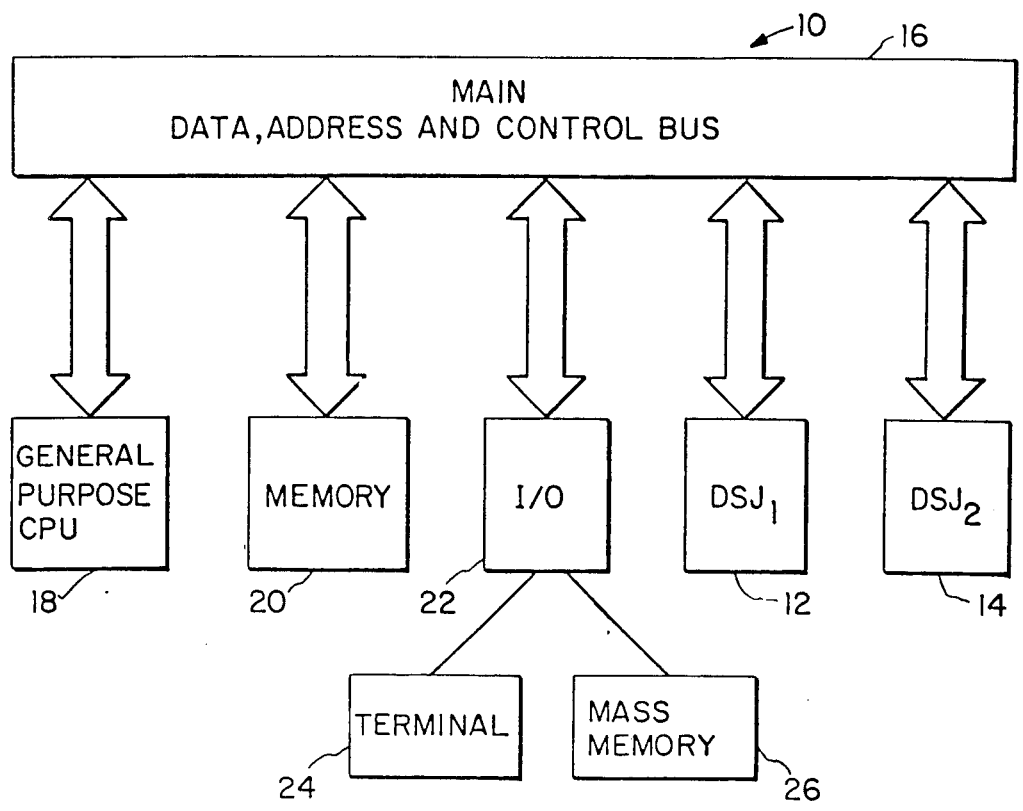
FIG.—1
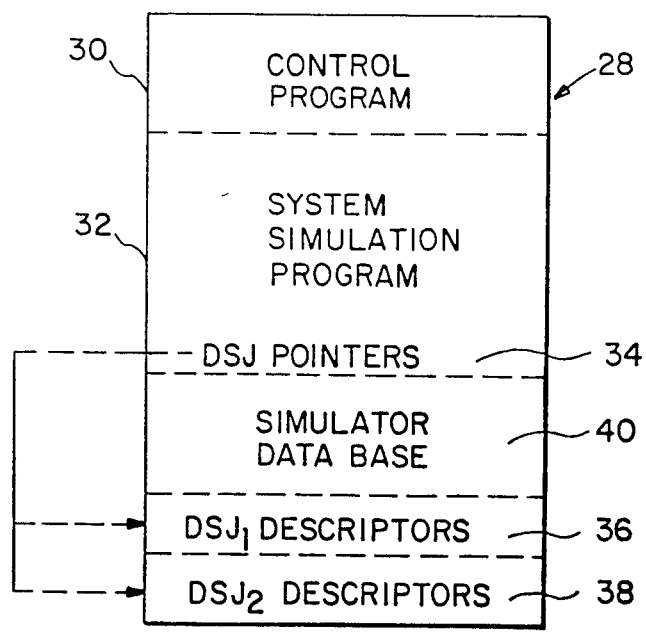
FIG.—2

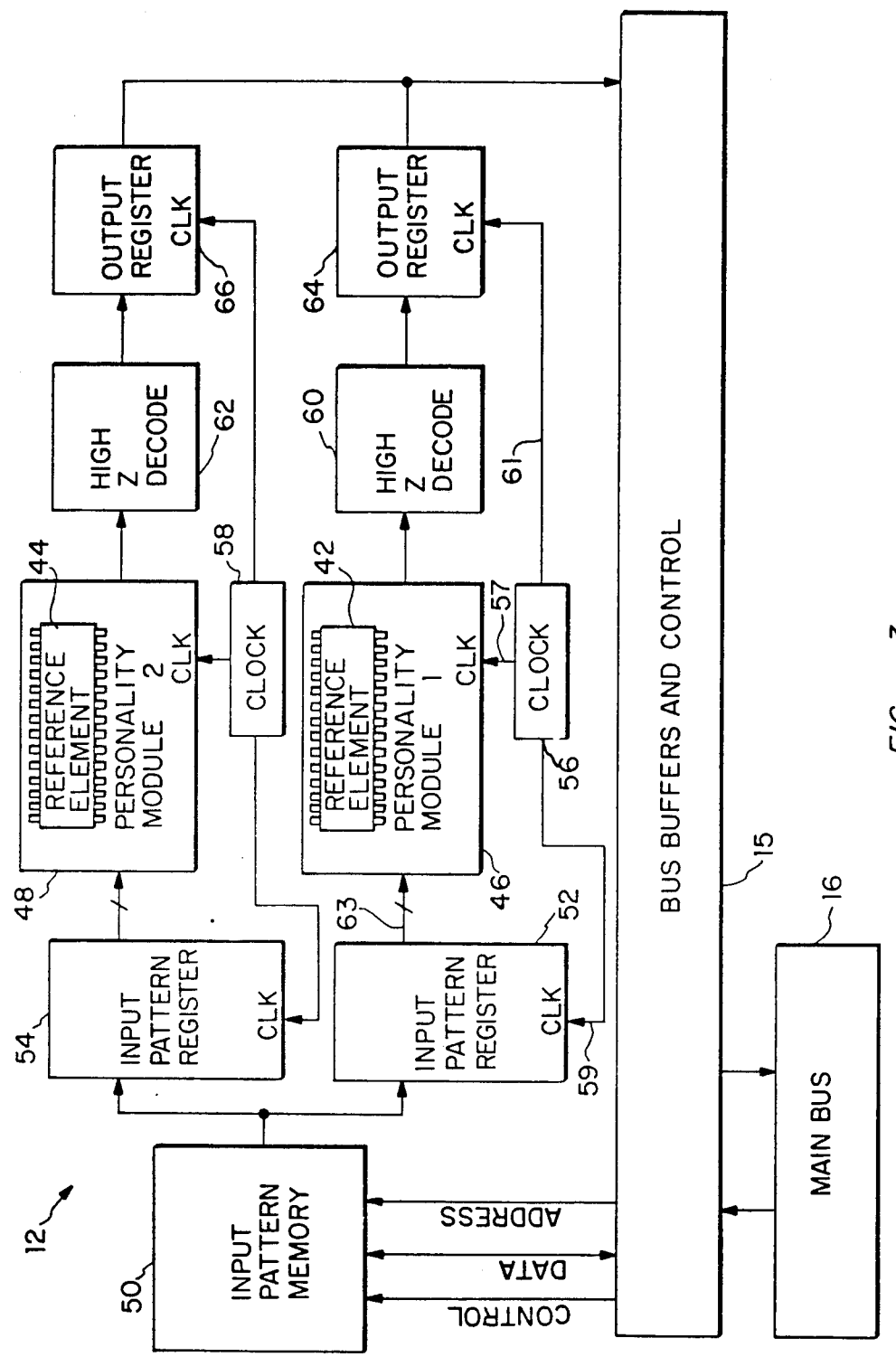
FIG.—3

METHOD FOR SIMULATING SYSTEM OPERATION OF STATIC AND DYNAMIC CIRCUIT DEVICES

CROSS REFERENCE TO RELATED APPLICATION

This application is a continuation-in-part of U.S. application Ser. No. 492,985 filed May 9, 1983 now U.S. Pat. No. 4,590,581. The disclosure thereof is incorporated herein and made a part hereof.

BACKGROUND OF THE INVENTION

This invention relates to modeling of operation of complex large scale integration (LSI) or very large scale integration (VSLI) devices for use in development and testing of complex circuitry and systems. More specifically, the invention relates to logic simulation and testing of complex digital circuitry and systems including those capable of executing instructions under program control in which performance characteristics of LSI or VLSI devices must also be accurately simulated. In particular, this invention is related to solutions to problems related to development of logic-simulation models built around hardware library elements, as disclosed in the parent application. It is believed that to date no one other than the present inventor and his co-workers is active in this field.

A logic-simulation model of a device is a diagnostic tool which accurately mimics logical and timing behavior of a device in normal operation. The purpose of such a model is to verify both logic and timing of an operational digital system containing the device. In a logic-simulation model, internal operation and internal structure need not be similar to that of the actual device being simulated. The only prerequisite is that the operation as externally observed be similar to the actual device being modeled.

Conventional logic-simulation models have been implemented with software. The present invention in contrast is a development around logic simulation models based on library elements which are the actual hardware devices and which interact with other library elements through a combination of hardware and software.

Software logic-simulation models have been of two types, namely, structural models and behavioral models. A structural model mimics actual internal logical structure of a device from which observable functional behavior follows. A behavioral model merely mimics external logical and timing behavior.

Software models of complex devices have numerous disadvantages. First, they are relatively costly and time consuming to develop. Also, to design an accurate model, specifications of the device must be gathered and thoroughly understood. This has been a serious limitation because manufacturers of devices are generally reluctant to disclose such details. Moreover, the specifications required for modeling a device are typically much more detailed than those relevant to a typical user of the device.

Furthermore, software simulation models are characteristically slow because of the amount of computation required to simulate device functions. Typically, the amount of computation required to simulate external components is negligible compared with the amount of computation required to simulate the complex device itself. In fact, software logicsimulation models are frequently too slow to be of practical utility.

Heretofore, there have been few tools available to simulate operation of a complex circuit. Moreover, it has been discovered by this inventor that it is difficult to simulate circuit operation of dynamic circuit devices in circuit combination with static circuit devices when employing physical specimens as reference elements. Dynamic circuit devices are constrained to operate at a clock rate within a narrow range of variation. In the present invention, the simulator can make use of physical specimens of dynamic or static devices which can be reset to an initial state or otherwise known state through use of a reset signal or reset command sequence.

Static circuit devices may not synchronize all inputs at clock edges to that any change at any time of the values of the input signals has a potential effect on the outputs of the device. Consequently, the full history of the input behavior of a static circuit device is usually so long that it is impractical to store it in a limited-sized memory and to present it to the reference element simulation model in a reasonable amount of time.

SUMMARY OF THE INVENTION

According to the invention, in a circuit system simulation model which may comprise a combination of physical dynamic circuit devices to be modeled, of physical static circuit devices to be modeled, and of means for controlling at least the operating sequence of the physical devices, a method is provided for exercising the circuit devices which comprises segregating strobe input signals from nonstrobe input signals to be presented to each circuit device and preserving order of strobe input transitions relative to each other and to nonstrobe input transitions while ignoring the order of nonstrobe input transitions relative to one another when presenting a sequence of input patterns to each physical circuit device.

As used herein, a strobe input is any input which when changed can induce a change of memory state in a reference element, and a nonstrobe input is any input which when changed at any frequency any number of times and returned to the initial value has no effect on the internal memory state of a reference element regardless of the values of any other inputs as long as the reference element is operated according to specification.

For any reference element, all input pins can be designated as either strobe pins or nonstrobe pins. In particular, "clock" pins and any "write enable" pins are always strobe pins. On the other hand, the data inputs of a clocked two-input multiplexer (e.g. the Motorola 10173) are nonstrobe pins.

In a specific embodiment, a physical sample of the device being modeled, for example a static digital circuit, such as certain microprocessor circuits (AM 2901), is emloyed in connection to a digital system to be simulated, the system including other digital circuits to be simulated in the environment of the system. The physical sample herein called the reference element is coupled through a device herein designated as a personality module to a device herein designated as a simulation jig. The purpose of a personality module is to provide the electrical and physical configurations for interfacing a specific reference element with a particular simulation jig. The simulation jig is coupled to a computer controlled system herein designated a logic-simulator thereby to provide appropriate input signals and to sample the resulting output signal in such a way that the user need not be aware that the model is a software model or a hardware model.

In a particular embodiment, two consecutive patterns in an input pattern sequence are stored to represent a strobe input transition, the first pattern representing the final values of all nonstrobe inputs just before the strobe transition, and the second pattern specifically for presenting the strobe transition to the reference element.

The invention will be better understood by reference to the following detailed description taken in connection with the accompanying drawings.

BRIEF DESCRIPTION OF THE DRAWINGS

FIG. 1 is a block diagram of a simulation system with simulation modeling apparatus.

FIG. 2 is a representation of a memory map of a computer controlled simulation system.

FIG. 3 is a block diagram of a simulation jig operative according to the invention.

DESCRIPTION OF SPECIFIC EMBODIMENTS

In order to better understand the invention, it is helpful to consider operation of a simulation system capable of employing the inventive method. The inventive method will then be illustrated by an example.

Referring to FIG. 1, there is shown a simulation system 10 as might be configured in a general purpose digital computer having a general purpose central processing unit (CPU) 18 coupled to a main bus 16. The simulation system further may include a memory means 20 and input/output means (I/O) 22 coupled to the main bus 16. A control terminal 24 and mass memory 26 are coupled through the I/O 22 to the main bus 16. Whereas a completely software-based simulation requires no other hardware, in the present invention a first simulation jig (DSJ$_1$) 12 and/or a second simulation jig (DSJ$_2$) 14 may be coupled to the main bus 16. The function of the simulation jigs 12 and 14 are explained in connection with FIG. 3.

Referring to FIG. 2, there is shown schematically how the software of the simulation system 10 may be organized in a memory map 28 of the memory 20. Memory space is set aside for a computer system control program 30 in memory 20. A system simulation program 32 is stored as object code in memory 20. Also stored in memory 20 are pointers 34 to descriptors 36 and 38 of the simulation jigs 12 and 14. A simulator database 40 containing working data values for the system simulation program is stored on-line in memory 20. Memory 20 is also used to store data as required by the simulation program from the mass memory 26.

Consider operation of a simulation jig 12 operative to present input patterns through an input pattern register 52 to a device herein known as a reference element 42, as shown in FIG. 3. (Most control signal lines have not been shown to avoid unnecessary complexity. Implementation of control functions is within the skill of the ordinary designer from the present description.) One or more clock signals having preselectable shape, clock rate and relative phase relationship may be presented by a clock 56 via clock lines 57, 59 and 61 to a personality module 46, the input pattern register 52 and the output register 64. The personality module 46 is a customized interface device which provides signal level matching and a suitable socket for a general purpose simulation jig 12. The simulation jig 12 is operative to present a set of input signals to the reference element 42 synchronous with the clock 56, which input signals represent values stored in an input pattern memory 50 containing the full set of defined input signal patterns in logical sequence. The input pattern memory 50 may be a serial or random access memory device with control lines and ports appropriate to the type of memory element selected.

At a fixed time relative to each clock period or edge, the input pattern register 52 of the simulation jig 12 is operative to produce output signals as if it were operating in a real-time environment in response to the defined input signal pattern. However, the output signals are ignored by the data recovery element, namely the output register 64, until all available input patterns in a sequence have been presented to the reference element 42. After the last input pattern has been presented to the reference element 42, clocking stops. An interval follows which is greater than the maximum specified delay of any output of the reference element 42. Thereupon the output values are sampled and stored in the output register 64. Thereafter, the simulator system 10 (FIG. 1) to which the simulation jig 12 is coupled via bus buffers and control 15 and main bus 16 examines the state of each output of the reference element 42. The states are evidenced by the values in the output register 64. The simulator system 10 then schedules the simulated outputs in the simulator data base 40 to change at specific delay times after the input transition corresponding. The specified delay time for each output is a function of the identity of the output which changes and the identity of the input which causes the change. It can be set to any time value between the minimum and the maximum delay as specified by the manufacturer and is a parameter which is specified in the definition of the device corresponding to the reference element 42. (Experience suggests that the maximum delay time be chosen in order to reveal the most timing errors in a design under development.)

Referring to FIG. 3 there is shown a representative circuit device as reference element 44 operated on the second personality module 48 in accordance with the method of this invention. The reference element 44 typically includes internal memory in which results of internal operations are stored. The memory is frequently cleared, reset or the contents otherwise changed.

According to the invention, a reference element 44 is rendered usable by a logic simulator 10 (FIG. 1) in a simulation system by separating strobe input signals from nonstrobe input signals while preserving the order of strobe signal transitions relative to strobe and nonstrobe signal transitions. Both strobe and nonstrobe input signals are applied to the reference element 44 by means of the input pattern register 54 (FIG. 3).

A single static or dynamic circuit device may be used as a reference element 44 to model several identical devices in a modeled system according to the invention. The reference element 44 can be exercised once for each circuit. Resulting signal values are stored in an output register 66 and eventually transferred to the memory 20 (FIGS. 1 and 2) in the simulation task.

According to the invention, the simulator system 10, with each occurrence of a transition of a nonstrobe input signal alters the last pattern in the sequence to contain all current values of all strobe and nonstrobe inputs, presents the entire sequence from the time of initialization to restore the state of the reference element, samples the outputs to sense the changes which occur in response to the nonstrobe input transition, schedules the occurrence of any resulting output transitions to occur in the simulated system, and awaits the occurrence of the next nonstrobe or strobe transition. This altering step results in a reduction of pattern sequence length since no patterns are stored to preserve timing of nonstrobe input transitions relative to other nonstrobe input transitions.

In response to a strobe transition, the simulator system 10 alters the last previous input pattern in the sequence so it is consistent with the current nonstrobe input values and then adds a new pattern in the sequence in which the current values of the strobe input signals as well as the nonstrobe input signals are stored. In addition, a second pattern is added in the sequence to be used for accumulating altered nonstrobe transitions until the occurrence of the next strobe transition.

The invention has now been explained with reference to specific embodiments. Other embodiments will be apparent to those of ordinary skill in the art. Therefore, it is not intended that this invention be limited, except as indicated by the appended claims.

What is claimed is:

1. In an apparatus for simulating operation of a digital circuit system, a method for modeling operation of a digital device in said digital circuit system, comprising:
    employing a physical specimen of said digital device as a reference element;
    segregating strobe input signals from nonstrobe input signals; and
    preserving order of strobe input signal transitions relative to each other and between strobe input signal transitions and nonstrobe input signal transitions while ignoring the order of nonstrobe input signal transitions relative to other nonstrobe input signal transitions in order to minimize required memory size while preserving a history of relevant input patterns to be presented to said reference element.

2. The method according to claim 1 wherein said modeling operation comprises presenting a sequence of stored patterns to said reference element from a time of initialization and wherein said preserving step comprises:
    altering the last one of said stored patterns to contain all current values of all strobe input signals and all nonstrobe input signals in response to each nonstrobe input signal transition, and in response to any strobe input signal transition preserving the last one of said stored patterns containing all current values of all nonstrobe input signals, and the values of all strobe input signals before the strobe input signal transition, appending a second pattern after said last pattern in said sequence, said second pattern containing all current values of said strobe input signals and of said nonstrobe input signals, and appending a third pattern to said last pattern in said sequence, said third pattern for use in accumulating altered nonstrobe input signals until occurrence of a subsequent strobe input transition, and wherein said preserving step is repeated at each occurrence of a strobe input signal transition.

3. In an apparatus for simulating operation of a digital circuit system, a method for modeling operation of a digital device in said digital circuit system wherein a physical specimen of said digital device is employed as a reference element, said method comprising:
    segregating strobe input signals from nonstrobe input signals;
    presenting strobe input signal transitions to said digital device
    as a sequence consisting of pairs of digital patterns each of said pairs consisting of a pattern containing values of all input signals before a particular strobe input signal transition and a pattern containing the values of all input signals after the particular strobe input signal transition;
    stopping the presentation of said sequence of patterns at a preselected transition unrelated to states of said digital device;
    sampling output signals of said digital device after said preselected transition in order to allow said simulation system to respond to said sampled output signals; and
    storing said sampled output signals as a pattern representative of an output response of said digital device to said preselected transition.

4. The method according to claim 3 wherein said storing step comprises storing input signal values in memory locations corresponding to the current last one of said patterns.

5. The method according to claim 3 wherein said strobe input signal presenting step comprises activating a strobe signal line of digital circuit.

6. The method according to claim 3 further comprising preserving the order of a sequence of said strobe input signal transitions as among each other and as relative to nonstrobe input signal transitions.

7. The method according to claim 6 wherein said preserving step comprises:
    altering the last one of said stored patterns to contain all current values of all strobe input signals and all nonstrobe input signals in response to each nonstrobe input signal transition, and in response to any strobe input signal transition, preserving the last one of said stored patterns containing all current values of all nonstrobe input signals, and values of all strobe input signals before the transition, appending a second pattern after said last pattern in said sequence, said second pattern containing all current values of said strobe input signals and of said nonstrobe input signals, and appending a third pattern to said last pattern in said sequence, said third pattern for use in accumulating altered nonstrobe input signal transitions until occurrence of a subsequent strobe input transition, and wherein said preserving step is repeated at each occurrence of a strobe input signal transition.

8. The method according to claim 6 wherein said digital device is a static circuit device.

9. The method according to claim 6 wherein said device is a dynamic circuit device.

10. The method according to claim 3 wherein said digital device has time-shared input/output terminals and wherein said method further includes the step of sensing fully states of said input/output terminals.

11. The method according to claim 3 wherein said digital device is a static circuit device.

12. The method according to claim 3 wherein said digital device is a dynamic circuit device.

13. The method according to claim 3 wherein said presenting step occurs at a transition rate which differs from a transition rate associated with operating said simulation system.

14. The method according to claim 3 wherein said sampling step includes sampling said output signals after a delay greater than a specified maximum delay for change in any output signal.

15. The method according to claim 3, further including the step of prestoring said sequence of input signals in a memory means prior to said presenting step.

16. The method according to claim 15 further including the step of prestoring repetitive segments of said sequence of input strobe signals as a single segment.

17. In an apparatus for simulating operation of a digital circuit system, an apparatus for modeling operation of a digital device in said digital circuit system comprising:

physical specimen of said digital device as a reference element;

means coupled to said physical specimen for segregating strobe input signals from nonstrobe input signals; and means for preserving order of strobe input signal transitions relative to each other and between strobe input signal transitions and nonstrobe input signal transitions while ignoring the order of nonstrobe input signal transitions relative to other nonstrobe input signal transitions in order to minimize required memory size while preserving a history of relevant state changes of inputs to said reference element.

* * * * *